(12) United States Patent
Hagi et al.

(10) Patent No.: US 10,629,330 B2
(45) Date of Patent: Apr. 21, 2020

(54) SHIELDED CONDUCTION PATH

(71) Applicant: Sumitomo Wiring Systems, Ltd., Yokkaichi, Mie (JP)

(72) Inventors: Masahiro Hagi, Mie (JP); Hiroshi Inoue, Mie (JP)

(73) Assignee: Sumitomo Wiring Systems, Ltd., Yokkaichi, Mie (JP)

(*) Notice: Subject to any disclaimer, the term of this patent is extended or adjusted under 35 U.S.C. 154(b) by 18 days.

(21) Appl. No.: 15/754,609

(22) PCT Filed: Aug. 10, 2016

(86) PCT No.: PCT/JP2016/073514
§ 371 (c)(1),
(2) Date: Feb. 23, 2018

(87) PCT Pub. No.: WO2017/038414
PCT Pub. Date: Mar. 9, 2017

(65) Prior Publication Data
US 2018/0254122 A1    Sep. 6, 2018

(30) Foreign Application Priority Data

Aug. 31, 2015    (JP) .................................. 2015-171067

(51) Int. Cl.
*H01B 7/04*    (2006.01)
*H01B 7/18*    (2006.01)
(Continued)

(52) U.S. Cl.
CPC ........... *H01B 7/18* (2013.01); *B60R 16/0215* (2013.01); *H01B 7/04* (2013.01); *H01R 4/20* (2013.01);
(Continued)

(58) Field of Classification Search
None
See application file for complete search history.

(56) References Cited

U.S. PATENT DOCUMENTS

| 5,277,619 A | * | 1/1994 | Yamamoto | H01R 13/4362 174/652 |
| 5,295,874 A | * | 3/1994 | Yoneda | H01R 13/115 439/850 |
| 5,545,854 A | * | 8/1996 | Ishida | H02G 3/081 16/2.2 |

(Continued)

FOREIGN PATENT DOCUMENTS

JP    H10-064624 A    3/1998

OTHER PUBLICATIONS

Search Report for PCT/JP2016/073514, dated Sep. 20, 2016.

*Primary Examiner* — Timothy J Thompson
*Assistant Examiner* — Muhammed Azam
(74) *Attorney, Agent, or Firm* — Honigman LLP (57) ABSTRACT

A shielded conduction path includes a conduction path main body in which sheathed electrical wires are surrounded by a tubular braided wire. An inner holder through which the sheathed electrical wires pass and is made of a synthetic resin. The shielded conduction path further includes a shield shell to which the braided wire is fixed and configured to house the inner holder. A lock hole is formed in a circumferential surface of the shield shell. A lock arm is formed in the inner holder, and locks the inner holder and the shield shell in an attached state by locking to the lock hole.

5 Claims, 13 Drawing Sheets

(51) Int. Cl.
*H01R 4/20* (2006.01)
*H01R 4/64* (2006.01)
*H01R 9/03* (2006.01)
*H02G 3/04* (2006.01)
*H02G 3/30* (2006.01)
*H05K 9/00* (2006.01)
*B60R 16/02* (2006.01)
*H01R 13/58* (2006.01)
*H01R 13/506* (2006.01)

(52) U.S. Cl.
CPC .............. *H01R 4/64* (2013.01); *H01R 13/506* (2013.01); *H02G 3/0462* (2013.01); *H02G 3/30* (2013.01); *H05K 9/0018* (2013.01); *H05K 9/0073* (2013.01); *H01R 4/646* (2013.01); *H01R 9/034* (2013.01); *H01R 13/5804* (2013.01); *H01R 2201/26* (2013.01)

(56) References Cited

U.S. PATENT DOCUMENTS

| | | | | |
|---|---|---|---|---|
| 6,218,625 B1* | 4/2001 | Pulaski | ............... | B60R 16/0222 174/153 G |
| 6,232,556 B1* | 5/2001 | Daugherty | ............ | H01R 12/61 174/88 R |
| 6,544,077 B2* | 4/2003 | Ikeda | ................. | H01M 2/1077 174/72 R |
| 6,561,465 B2* | 5/2003 | Kondo | ................. | F16L 3/1025 174/135 |
| 6,916,205 B1* | 7/2005 | Kaneko | ............... | H01R 9/0524 439/607.42 |
| 7,429,700 B2* | 9/2008 | Kanamaru | ........... | H01R 13/506 174/135 |
| 8,342,880 B2* | 1/2013 | Kato | ...................... | H01R 9/032 439/382 |
| 8,602,823 B2* | 12/2013 | Jimbo | ................ | H01R 13/6592 439/607.5 |
| 8,790,137 B2* | 7/2014 | Deno | .................... | H01R 13/648 439/607.41 |
| 8,827,214 B2* | 9/2014 | Ogawa | .................. | F16L 3/1041 248/74.1 |
| 9,040,846 B2* | 5/2015 | Suzuki | ............... | H01R 13/6581 174/359 |
| 9,071,024 B2* | 6/2015 | Shinba | ............... | H01R 13/6596 |
| 9,203,225 B2* | 12/2015 | Akuta | ...................... | H02G 3/32 |
| 9,774,109 B2* | 9/2017 | Tabata | .................. | H01R 11/05 |
| 9,966,715 B2* | 5/2018 | Ishibashi | .............. | H01R 13/424 |
| 2005/0247476 A1* | 11/2005 | Aihara | ............... | H01R 13/6272 174/50.52 |
| 2009/0035993 A1* | 2/2009 | Okayasu | ................ | H01R 4/185 439/607.41 |
| 2010/0000788 A1* | 1/2010 | Kawase | ............... | H01R 9/0509 174/74 R |
| 2010/0155135 A1* | 6/2010 | Yamamoto | ............ | F21V 21/002 174/536 |
| 2011/0284266 A1* | 11/2011 | Deno | .................. | B60R 16/0215 174/136 |
| 2012/0021632 A1* | 1/2012 | Matsumoto | .......... | H01R 13/506 439/271 |
| 2012/0058674 A1* | 3/2012 | Deno | .................... | H01R 9/0518 439/607.52 |
| 2012/0142214 A1* | 6/2012 | Kawamura | ............... | H01R 4/34 439/571 |
| 2012/0202381 A1* | 8/2012 | Deno | .................. | H01R 13/648 439/607.41 |
| 2012/0285729 A1* | 11/2012 | Imahori | ................. | H01R 9/032 174/152 R |

* cited by examiner

SHIELDED CONDUCTION PATH

This application is the U.S. national stage of PCT/JP2016/073514 filed Aug. 10, 2016, which claims priority of Japanese Patent Application No. JP 2015-171067 filed Aug. 31, 2015.

TECHNICAL FIELD

The present invention relates to a shielded conduction path.

BACKGROUND

JP 5528007B discloses a shielded conduction path that includes a conduction path main body in which a sheathed electrical wire is surrounded by a tubular braided wire, an inner holder through which the sheathed electrical wire passes and that is made of a synthetic resin, and a shield shell that is made of a metal and houses the inner holder, and an end portion of the braided wire is connected to the shield shell. In this shielded conduction path, the inner holder and the shield shell are locked in an attached state by locking a lance formed on the inner holder to a lance locking portion formed on the shield shell.

In the above-described shielded conduction path, the direction in which the sheathed electrical wire is inserted into the inner holder is opposite to the direction in which the inner holder is attached to the shield shell, and the attachment of the sheathed electrical wire and the inner holder is performed outside of the shield shell. For this reason, in the attachment process, the sheathed electrical wire needs to be inserted into the shield shell while the inner holder is not housed therein. However, the lance locking portion formed on the shield shell projects circumferentially inward in the shield shell, and therefore there is a risk that the lance locking portion will damage the insulating covering of the sheathed electrical wire.

The present invention was achieved in light of the above-described situation, and an object of the present invention is to prevent a sheathed electrical wire from being damaged by a shield shell.

SUMMARY

A shielded conduction path according to the present invention includes: a conduction path main body in which a sheathed electrical wire is surrounded by a tubular shield member; an inner holder through which the sheathed electrical wire passes and that is made of a synthetic resin; a shield shell to which the shield member is fixed, and that can house the inner holder and is made of a metal; a lock hole formed in a circumferential surface of the shield shell; and a lock arm that is formed on the inner holder, has a lock projection capable of locking to the lock hole, and locks the inner holder and the shield shell in an attached state, wherein the lock arm has a leg portion that rises on an outer surface of the inner holder, and an arm portion that extends from the leg portion, and the lock projection is provided protruding inward on a leading end portion of the arm portion.

Advantageous Effects of Invention

The lock hole is formed in the circumferential surface of the shield shell as a means for locking the inner holder and the shield shell in an attached state. The lock hole does not project from the inner circumference of the shield shell, and therefore even if the sheathed electrical wire slides over the inner circumferential surface of the shield shell, there is no risk of becoming damaged by the shield shell.

DETAILED DESCRIPTION OF PREFERRED EMBODIMENTS

The shielded conduction path according to the present invention may include a fixing member that can fix the sheathed electrical wire and the inner holder in a state of being positioned in an axial direction of the sheathed electrical wire. According to this configuration, when the shield shell is to be fixed to a vehicle body or the like in the state where the sheathed electrical wire has been inserted through the shield shell and the inner holder, there is no risk that the inner holder will move along the sheathed electrical wire and interfere with the shield shell, and therefore workability when fixing the shield shell is favorable.

In the shielded conduction path according to the present invention, the fixing member may be a tying band that comes into close contact with an outer circumferential surface of the inner holder and an outer circumferential surface of the sheathed electrical wire, and surround and constrict the inner holder and the sheathed electrical wire. According to this configuration, the inner holder and the sheathed electrical wire can be easily and reliably positioned and fixed.

In the shielded conduction path according to the present invention, a stopper that positions the tying band in a circumferential direction may be formed on the inner holder. According to this configuration, workability when fastening the tying band is improved.

In the shielded conduction path according to the present invention, the inner holder may be configured by a pair of half members that can be joined so as to sandwich the sheathed electrical wire in a diameter direction. According to this configuration, workability when attaching the inner holder and the sheathed electrical wire to each other is favorable.

In the shielded conduction path according to the present invention, the pair of half members may be provided with locking portions that can lock to each other and that hold the pair of half members in a joined state, and the locking portions may be housed in the shield shell. According to this configuration, there is no risk of the locking portions becoming separated due to interference with a foreign object, and the half members can be reliably held in the joined state.

First Embodiment

Hereinafter, a first embodiment of the present invention will be described with reference to FIGS. 1 to 13. In the first embodiment, the rightward direction in FIGS. 1 to 5 is defined as the forward direction in the forward-backward direction. Also, the upward and downward directions in FIGS. 3, 5, 6, and 8 to 11 define, as-is, the upward-downward direction.

A shielded conduction path of the present embodiment is constituted including one conduction path main body 10, an inner holder 20, a shield shell 40, and a tying band 50 (the fixing member recited in the claims). The conduction path main body 10 is constituted including two sheathed electrical wires 11, one tubular braided wire 14 (the shield member recited in the claims), and a crimp ring 56. The sheathed electrical wires 11 are each a known electrical wire in which one conductor 12 is surrounded by an insulating covering 13. The braided wire 14 is a flexible tubular portion obtained by braiding multiple metal strands into a mesh, and exhibits a shield function by surrounding the sheathed electrical wires 11.

Figure 12:
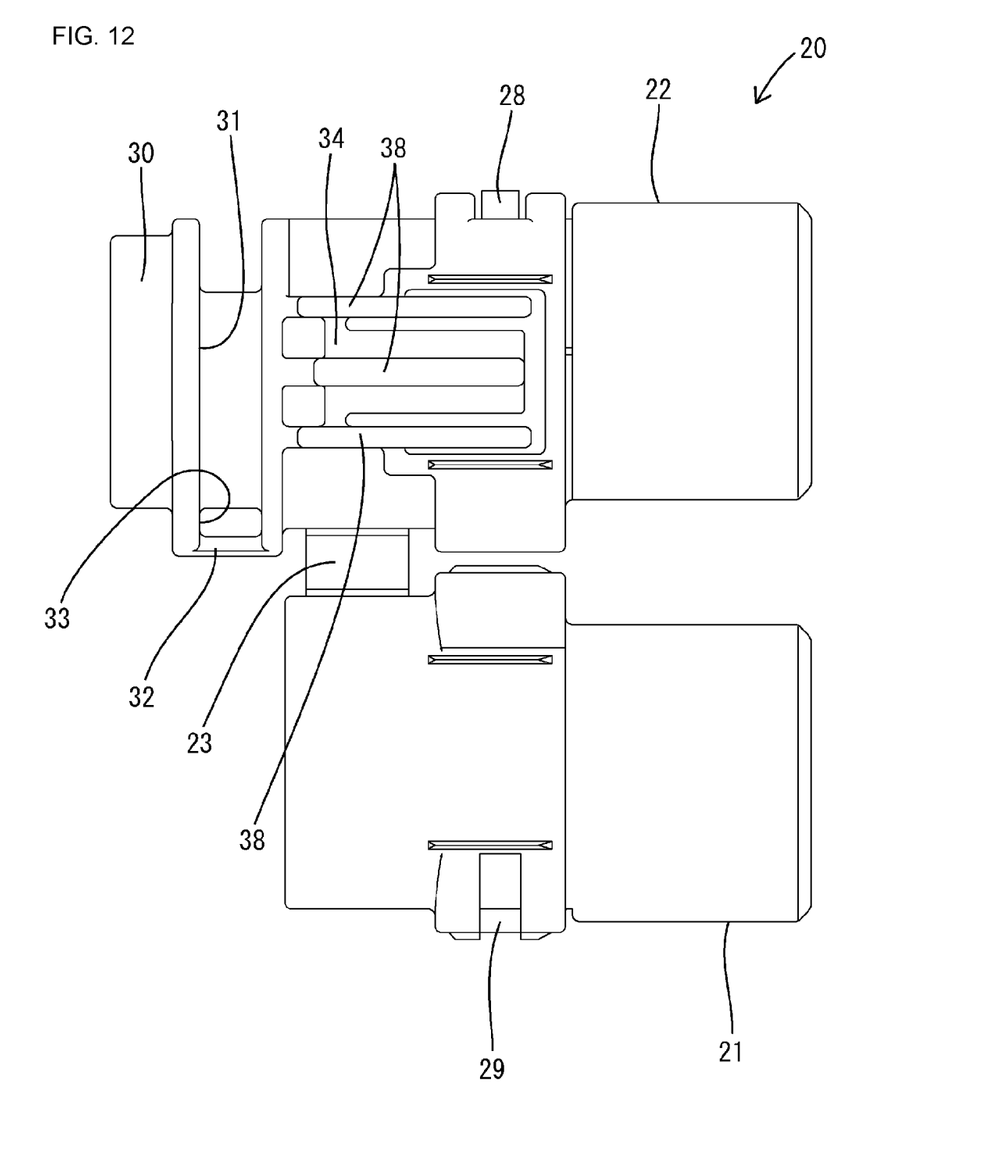
FIG. 12 is a bottom view showing a spread state before the joining of a lower half member and an upper half member.
Figure 13:
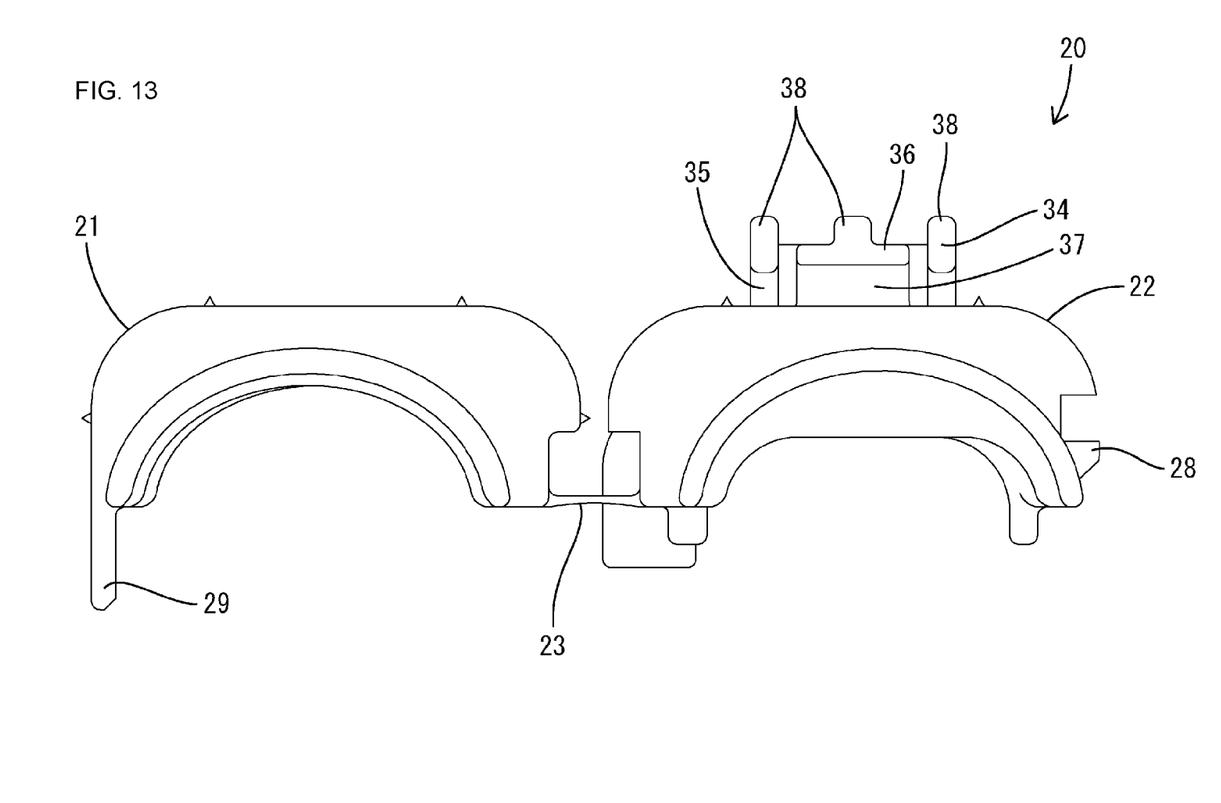
FIG. 13 is a rear view showing a spread state before the joining of the lower half member and the upper half member.

The inner holder 20 is made of a synthetic resin, and in terms of structure, is a single part in which a lower half member 21 (one of the half members recited in the claims) and an upper half member 22 (one of the half members recited in the claims) are coupled by a hinge portion 23, as shown in FIGS. 12 and 13. By deforming the hinge portion 23 and placing the upper half member 22 over the lower half member 21 so as to be joined thereto, the inner holder 20 is configured to overall extend in the forward-rearward direction.

In terms of functionality, as shown in FIGS. 1, 8, 10, and 11, the inner holder 20 includes a holder main body portion 24, an electrical wire holding portion 30, and a lock arm 34. The holder main body portion 24 is constituted including a box-shaped portion 25 that is open at the front and rear surfaces and a portion of the upper surface, a tubular portion 26 that is open at the front and rear surfaces, and an abutting portion 27 that connects the rear end of the box-shaped portion 25 and the front end of the tubular portion 26 with a step-like shape. The tubular portion 26 is one size smaller than the box-shaped portion 25, and the rear surface of the abutting portion 27 is exposed to the outside of the inner holder 20. The hinge portion 23 is arranged at the left side edge of the tubular portion 26.

A locking protrusion 28 (one of the locking portions recited in the claims) and a locking arm 29 (one of the locking portions recited in the claims) are formed on the right outward surface, which is on the side opposite to the hinge portion 23, among the outward surfaces of the rear end portion of the box-shaped portion 25. The locking protrusion 28 is formed on the outer circumferential surface of the upper half member 22. The locking arm 29 is formed so as to project upward from the outer circumferential surface of the lower half member 21. The two half members 21 and 22 are held in a joined state by the locking arm 29 being locked to the locking protrusion 28.

The electrical wire holding portion 30 extends forward in a cantilevered manner from the front end of the box-shaped portion 25. The electrical wire holding portion 30 is formed in only the upper region in the upward-downward direction. In other words, the electrical wire holding portion 30 is connected to the upper half member 22, but is not connected to the lower half member 21. A groove portion 31 that extends in the circumferential direction is formed in the outer circumferential surface of the electrical wire holding portion 30. Also, a stopper 32 is formed on one circumferential end portion (the left end portion) of the groove portion 31. An insertion hole 33 that penetrates in the upward-downward direction is formed in the stopper 32.

The lock arm 34 is constituted including a leg portion 35 that rises upward from the front end edge portion of the upper surface of the box-shaped portion 25, and an arm portion 36 that extends rearward in a cantilevered manner from the upper end of the leg portion 35. In other words, the shape of the lock arm 34 in a side surface view is approximately a vertical L shape. A lock projection 37 that projects downward is formed on the leading end portion of the arm portion 36. With the lower end of the leg portion 35 serving as the fulcrum, the lock arm 34 can elastically bend such that the leg portion 35 is displaced forward and the arm portion 36 is displaced upward. The lock projection 37 is displaced upward in accordance with this elastic bending of the lock arm 34.

Also, three reinforcement ribs 38, which extend in the forward-rearward direction along the upper surface of the arm portion 36 and extend in the upward-downward direction along the front surface of the leg portion 35, are formed on the outer surface of the lock arm 34. The three reinforcement ribs 38 are respectively arranged at the left and right edges of the lock arm 34 and the central position in the width direction. These reinforcement ribs 38 raise the rigidity of the lock arm 34.

Figure 1:
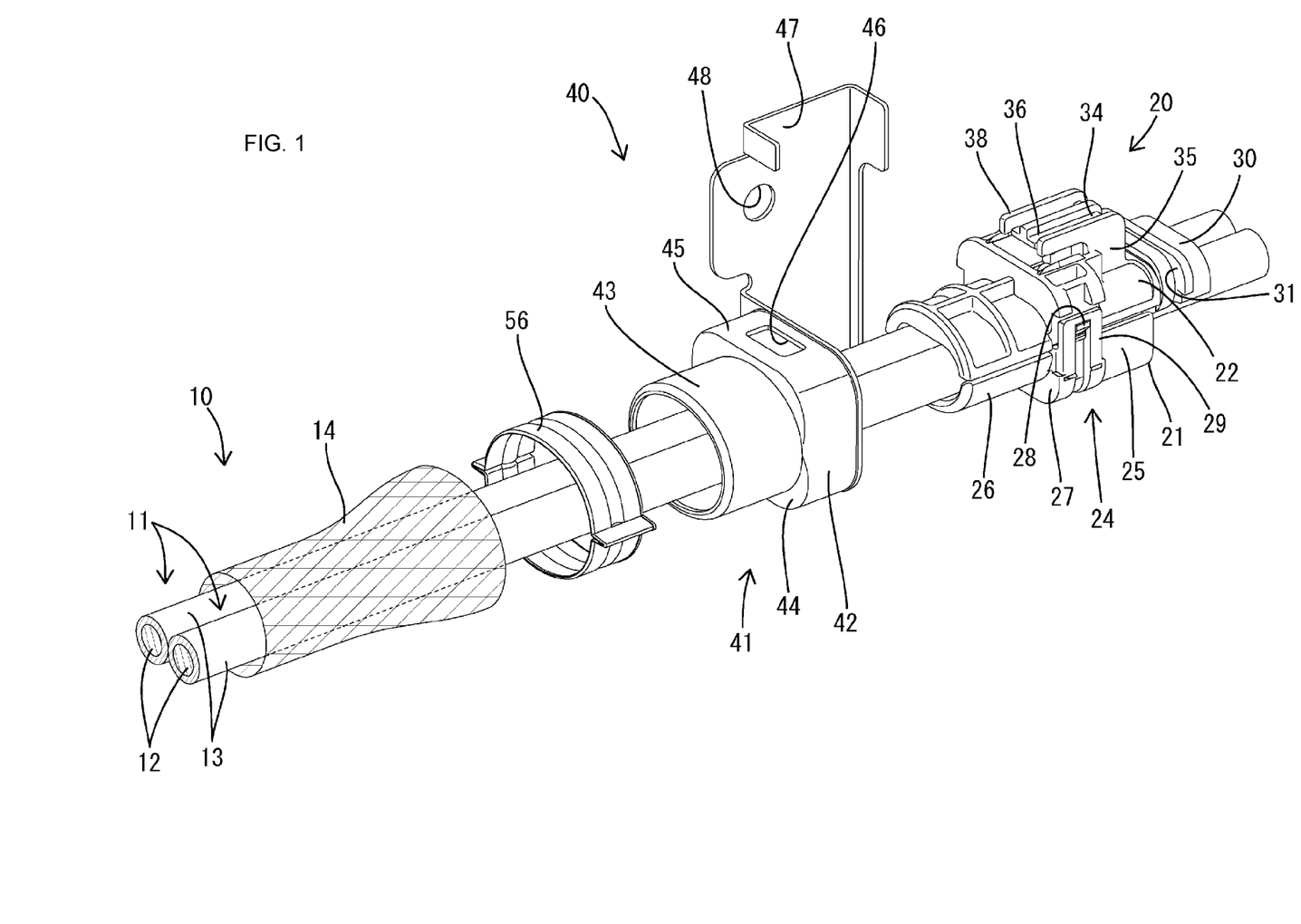
FIG. 1 is a perspective view showing an exploded state of a shielded conduction path according to a first embodiment.
Figure 2:
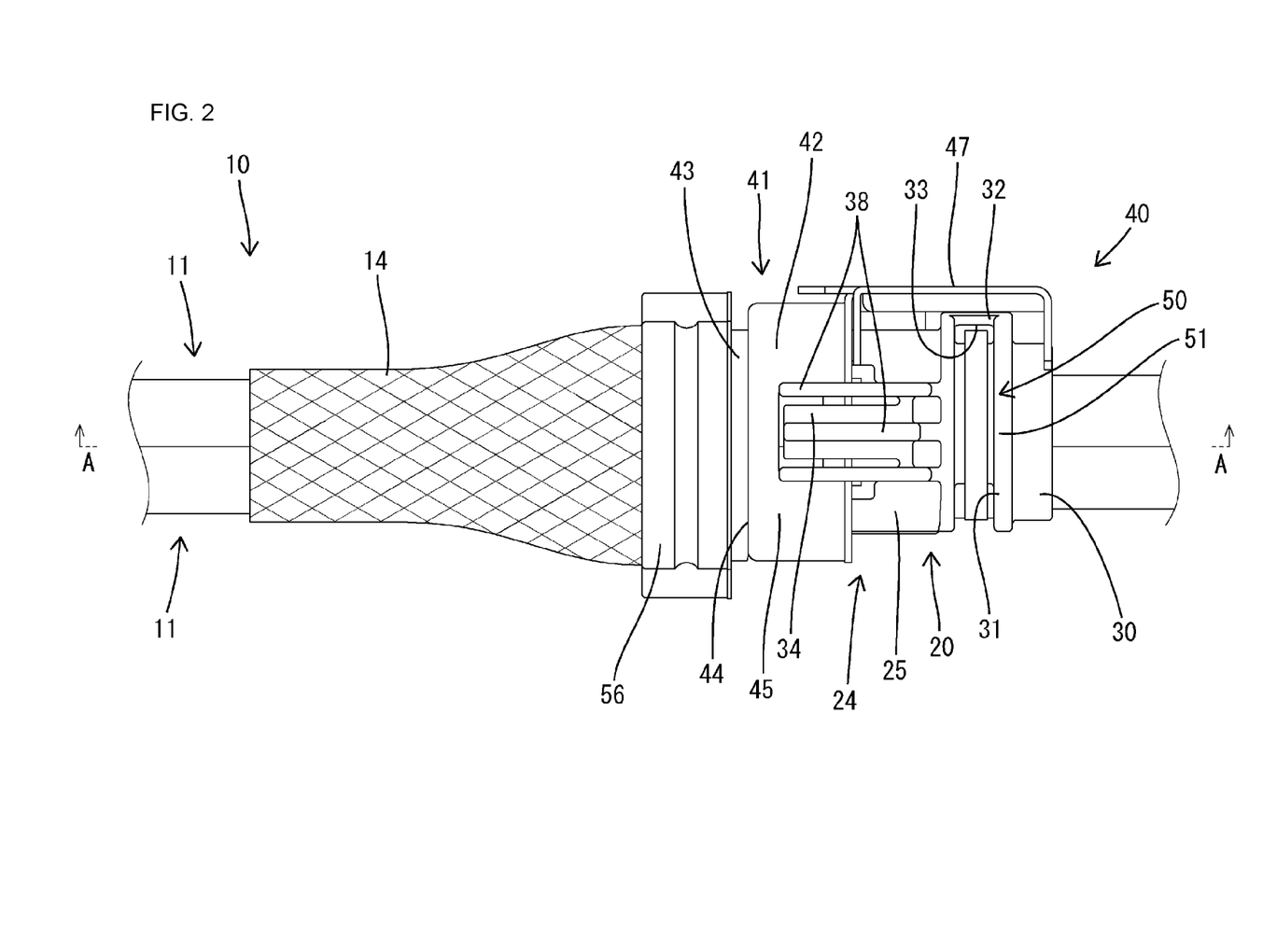
FIG. 2 is a plan view of the shielded conduction path.
Figure 3:
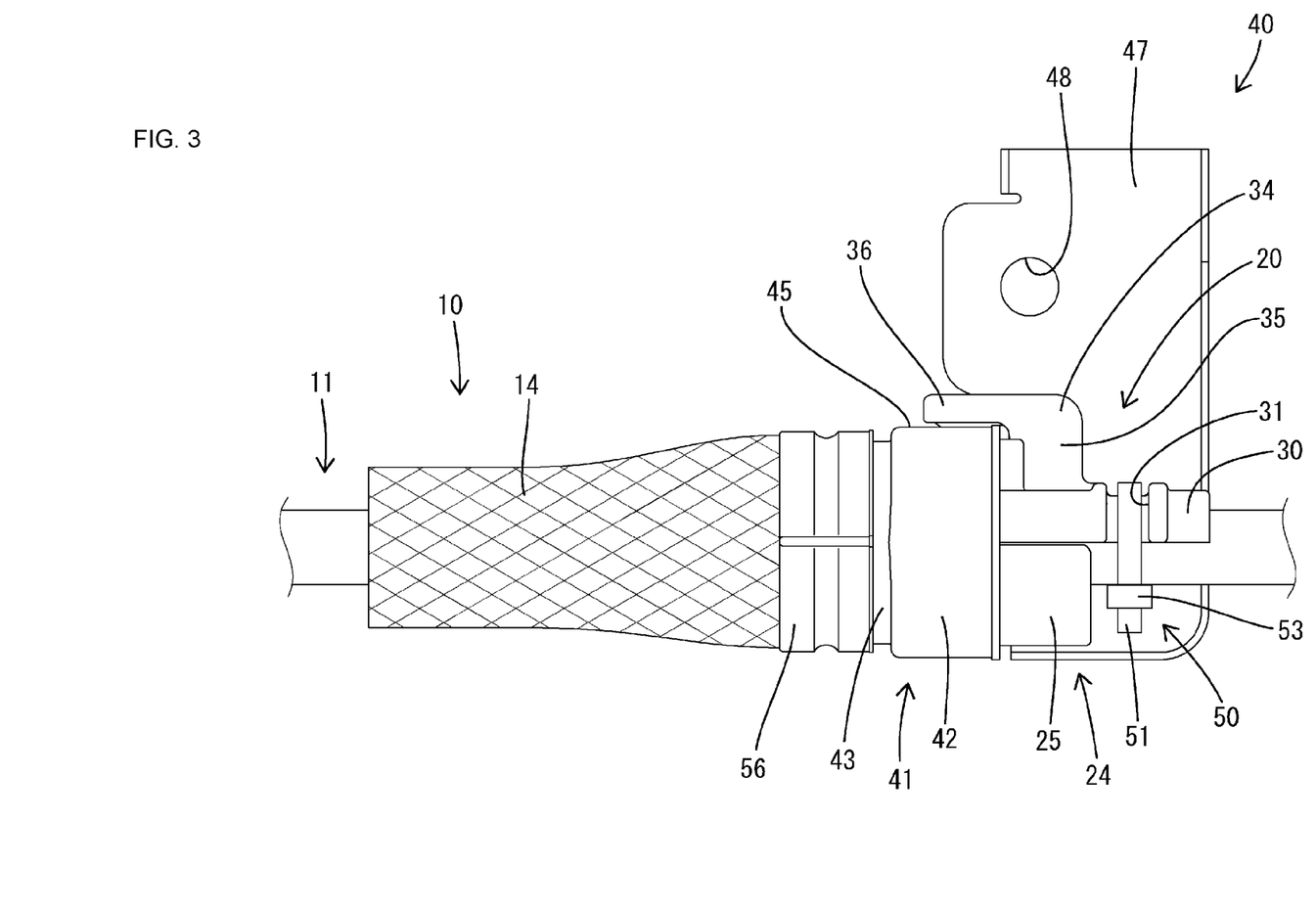
FIG. 3 is a side view of the shielded conduction path.
Figure 4:
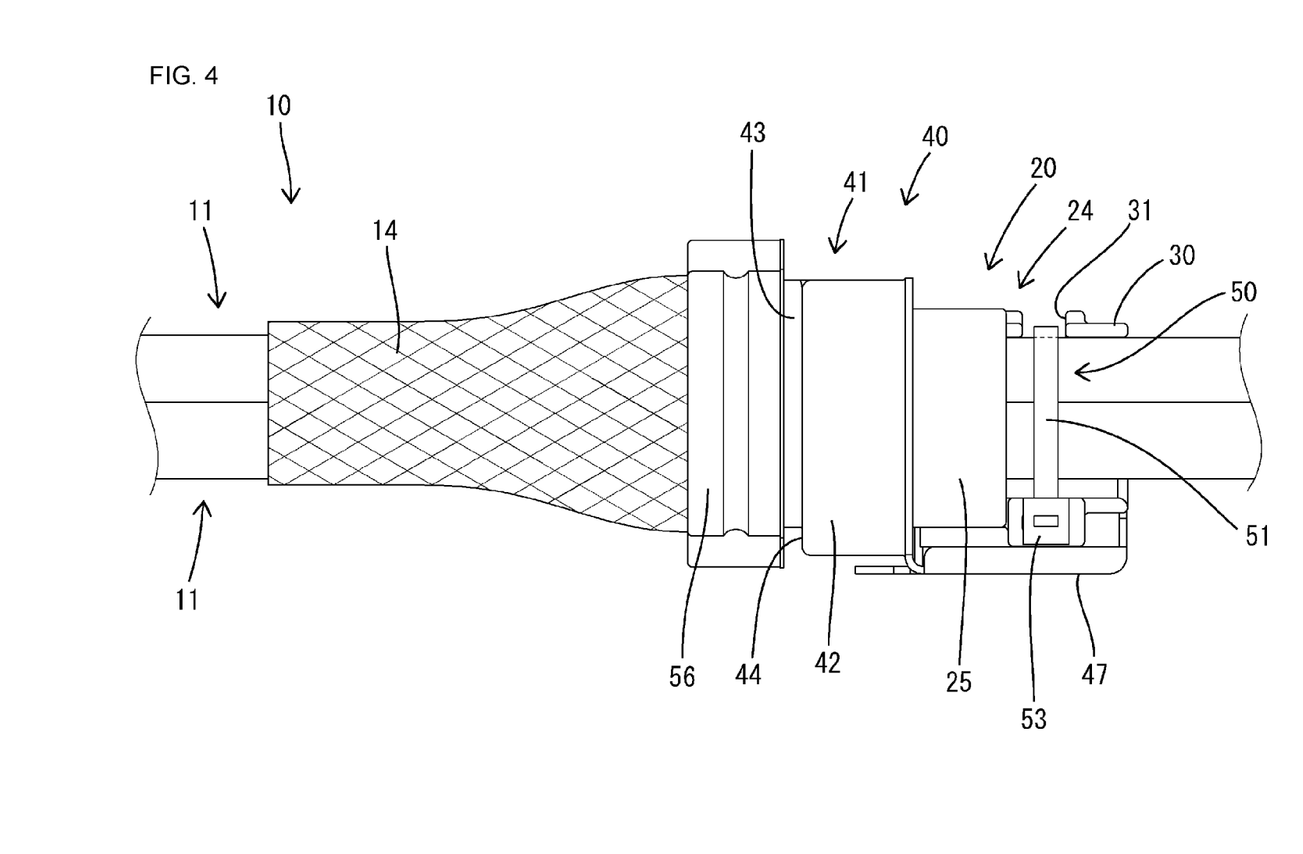
FIG. 4 is a bottom view of the shielded conduction path.
Figure 5:
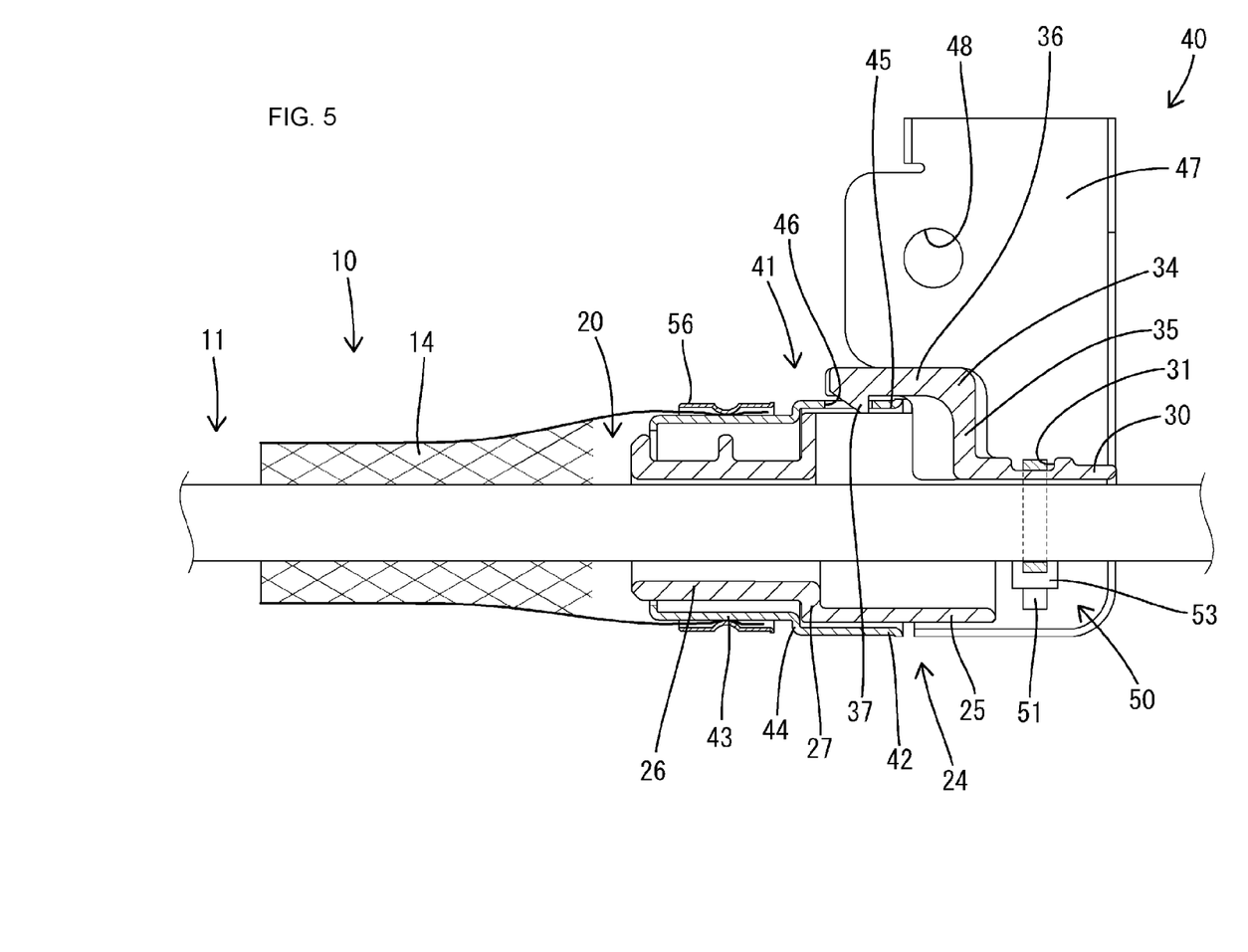
FIG. 5 is a cross-sectional view taken along line A-A in FIG. 2.
Figure 6:
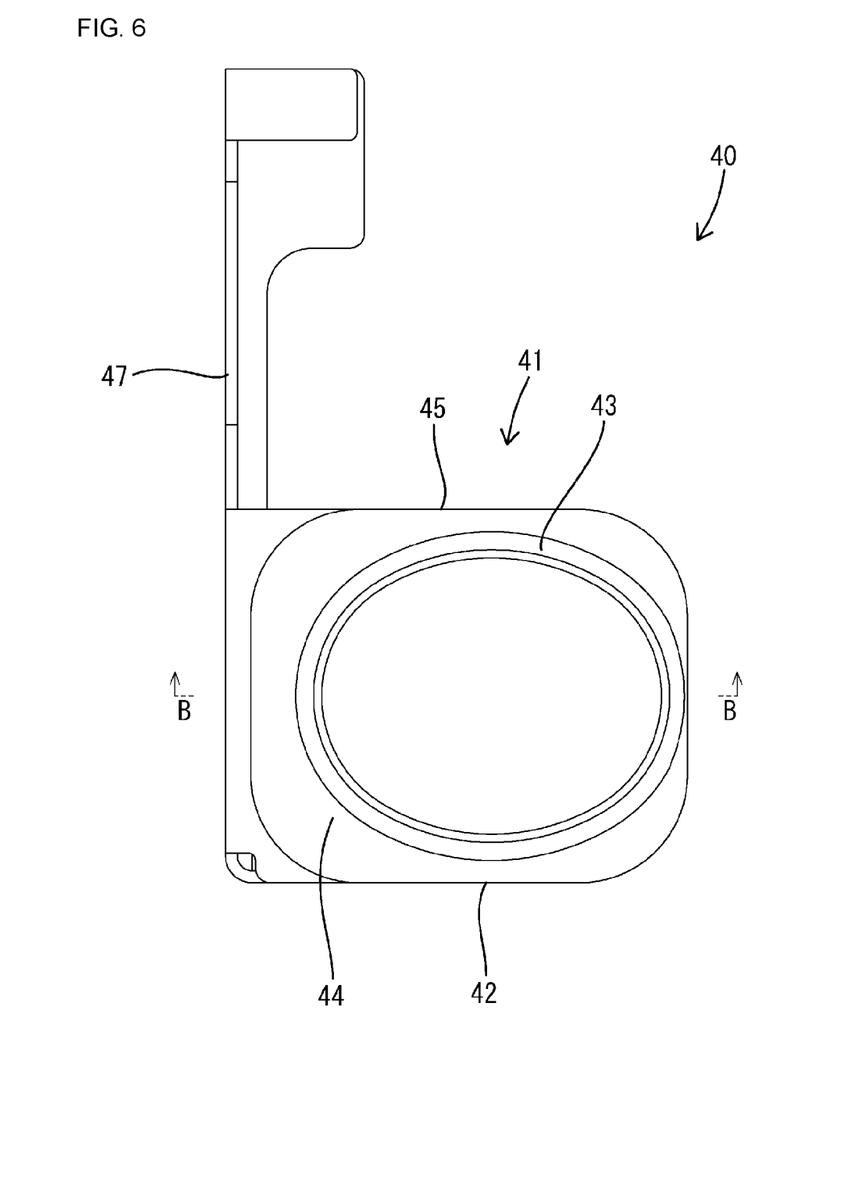
FIG. 6 is a rear view of a shield shell.
Figure 7:
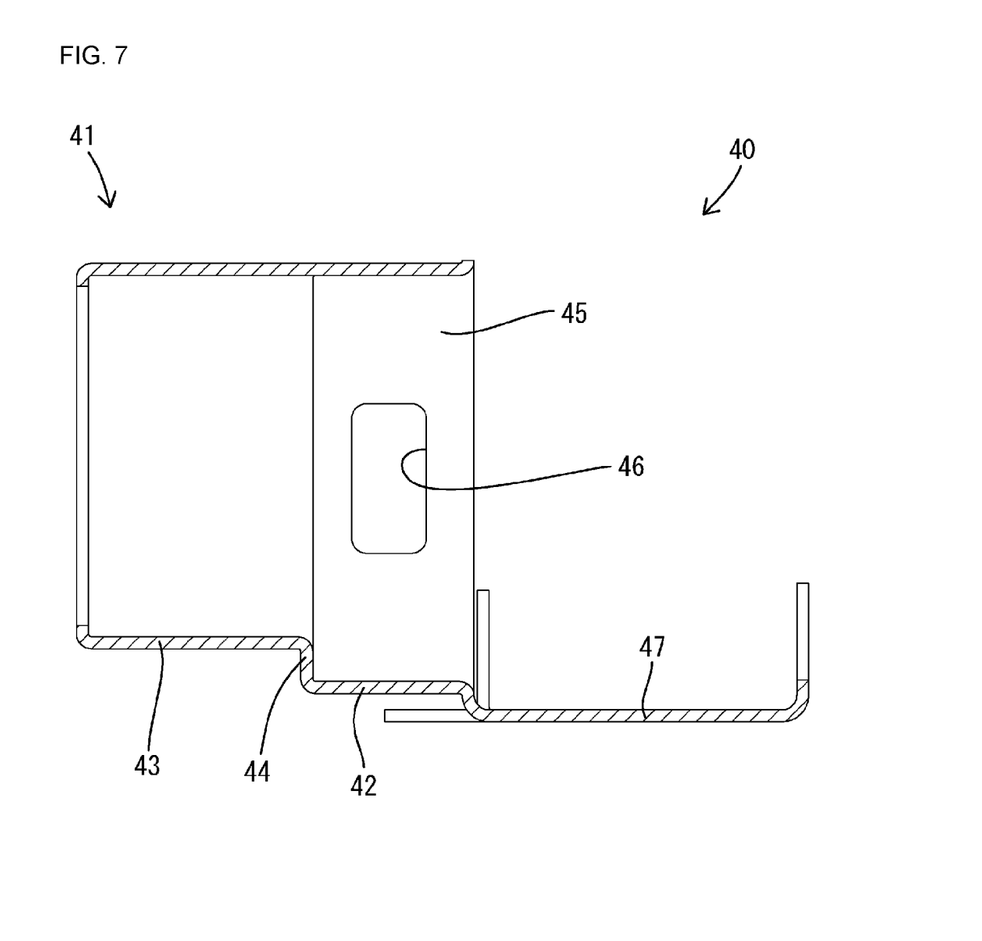
FIG. 7 is a cross-sectional view taken along line B-B in FIG. 6.
Figure 8:
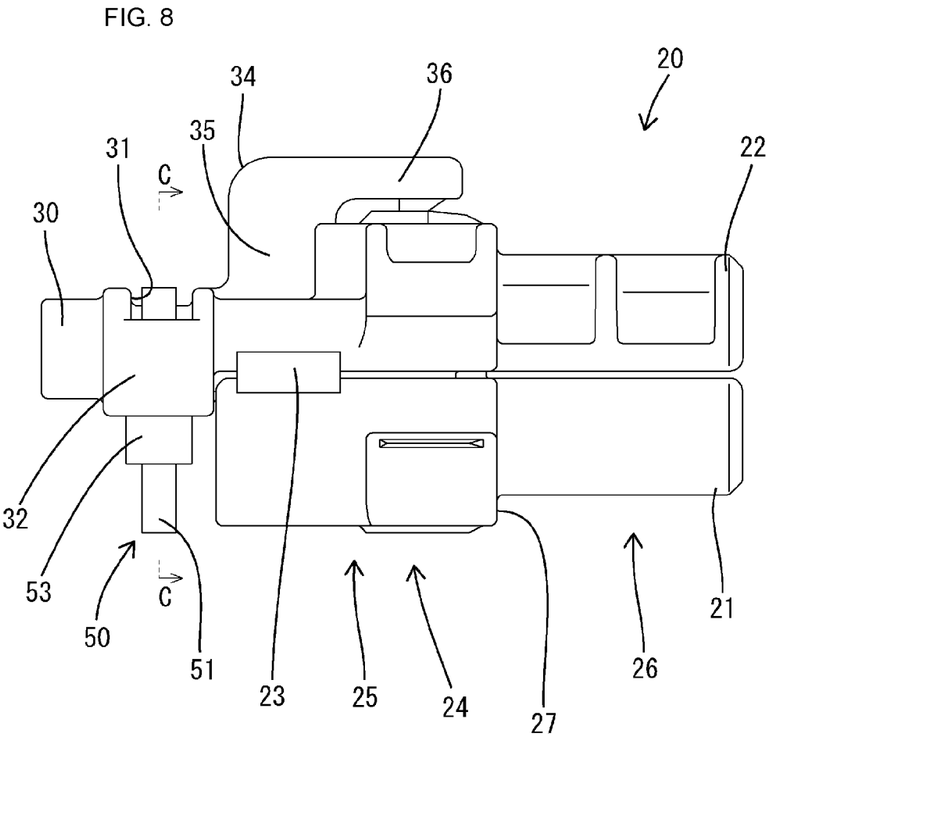
FIG. 8 is a side view of an inner holder.

The shield shell 40 is a single part that is made of a metal. As shown in FIGS. 1, 6, and 7, the shield shell 40 includes a shell main body portion 41 and an attachment portion 47. The shell main body portion 41 is constituted including a front tube portion 42 that is approximately quadrangular, a rear tube portion 43 that is approximately circular, and a receiving portion 44 that connects the rear end of the front tube portion 42 and the front end of the rear tube portion 43 with a step-like shape. The front tube portion 42 is one size larger than the rear tube portion 43, and thus the front surface of the receiving portion 44 faces the interior space of the front tube portion 42. A lock hole 46 that is approximately quadrangular in a plan view is formed in an upper plate portion 45 that constitutes the front tube portion 42. The lock hole 46 penetrates from the outer surface (upper surface) to the inner surface (lower surface) of the upper plate portion 45.

The attachment portion 47 is connected to the front end edge of a left side plate portion that constitutes the front tube portion 42. The attachment portion 47 is approximately parallel with the left side plate portion, and extends forward from the front end edge of the left side plate portion with a flat plate shape. A circular attachment hole 48 is formed in an upper end portion of the attachment portion 47. The shield shell 40 can be conductively attached to a grounding member such as a vehicle body by passing a bolt (not shown) through the attachment hole 48 and then screwing the bolt into a nut (not shown) that is fixed to the grounding member.

Figure 9:
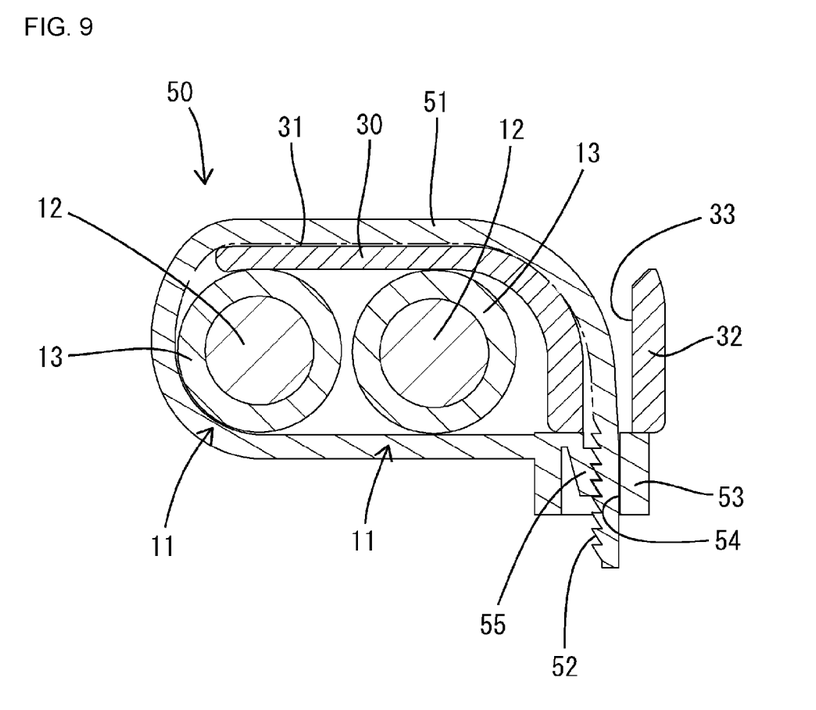
FIG. 9 is a cross-sectional view taken along line C-C in FIG. 8.
Figure 10:
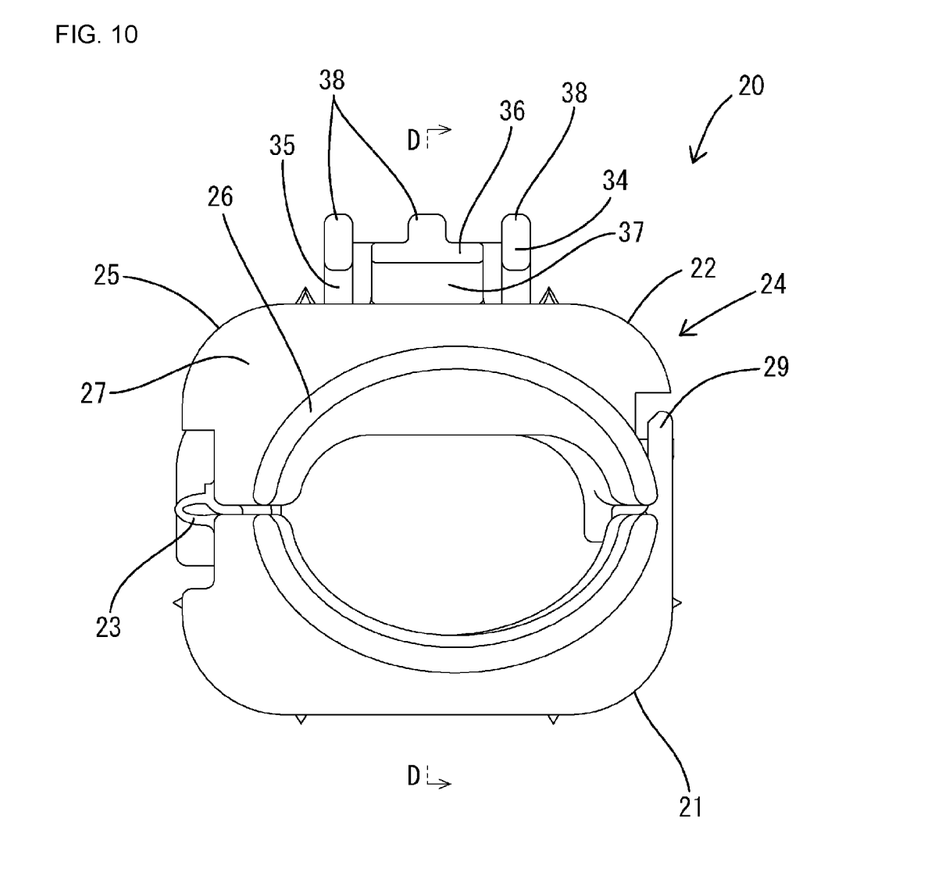
FIG. 10 is a rear view of the inner holder.
Figure 11:
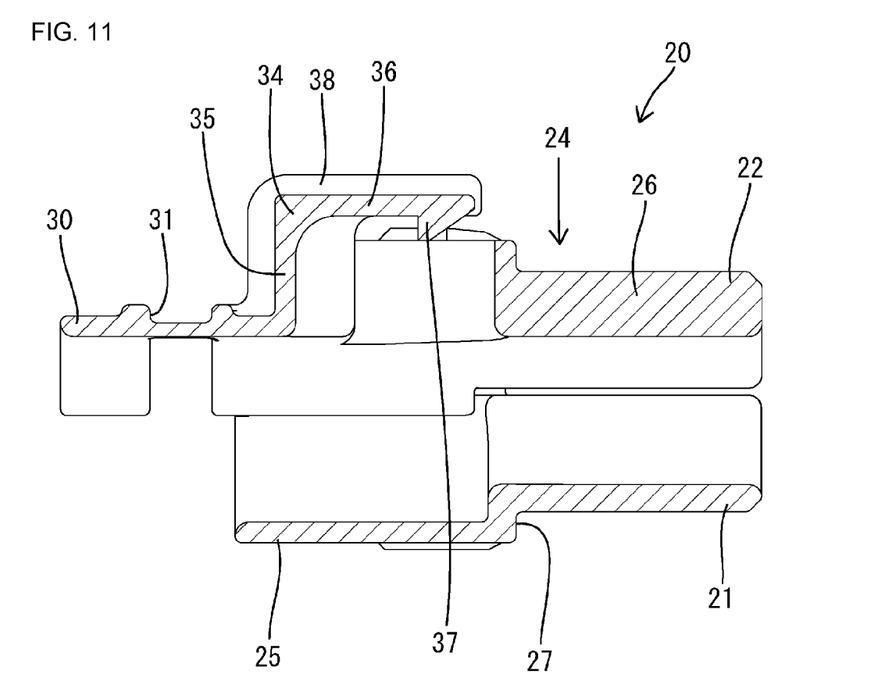
FIG. 11 is a cross-sectional view taken along line D-D in FIG. 10.

The tying band 50 is a known part that is flexible and is made of a synthetic resin. Specifically, as shown in FIG. 9, the tying band 50 is made up of a long and thin band portion 51 having saw tooth-shaped locking teeth 52 formed on the outer surface, and a head portion 53 that is formed at one end portion of the band portion 51. A locking hole 54 for insertion of the band portion 51 is formed in the head portion 53, and a retaining projection 55 for locking the locking teeth 52 is formed on the inner surface of the locking hole 54.

Next, a procedure for assembling the shielded conduction path of the present embodiment will be described. First, the sheathed electrical wires 11 are inserted into the braided wire 14 and the shield shell 40, and the front end portion of the braided wire 14 is fitted around the rear tube portion 43 of the shield shell 40 and conductively fixed thereto by the crimp ring 56. Either one of the step of inserting the sheathed electrical wires 11 into the braided wire 14 and the shield shell 40 and the step of fixing the braided wire 14 to the shield shell 40 may be performed before the other. Thereafter, the front end portions of the sheathed electrical wires 11 are drawn out forward from the shield shell 40.

Next, the front end portions of the drawn-out sheathed electrical wires 11 are placed in the recessed portion on the upper surface of the lower half member 21, and the upper half member 22 is placed over from above and joined to the lower half member 21. Accordingly, the inner holder 20 is obtained, and the sheathed electrical wires 11 are in a state of being inserted through the inner holder 20. After the two half members 21 and 22 have been joined, the band portion 51 of the tying band 50 is inserted through the insertion hole 33 of the stopper 32 and wrapped around the outer circumference of the electrical wire connection portion and the outer circumference of the sheathed electrical wires 11. At this time, the band portion 51 is fitted into the groove portion 31 of the electrical wire connection portion such that the tying band 50 portion is positioned relative to the inner holder 20 in the forward-rearward direction.

Then the band portion 51 is inserted through the locking hole 54 of the head portion 53, and the band portion 51 is pulled tight in a state where the inner holder 20 and the sheathed electrical wires 11 are positioned and aligned in the forward-rearward direction (the axial direction of the sheathed electrical wires 11). Accordingly, the band portion 51 digs into the outer circumference of the sheathed electrical wires 11 (the insulating coverings 13 thereof), and therefore the sheathed electrical wires 11 and the inner holder 20 are fixed via the tying band 50 in a state where relative displacement in the forward-rearward direction is restricted.

Thereafter, the inner holder 20 is housed in the shield shell 40. At this time, the inner holder 20 is inserted into the shield shell 40 from the front side. In the state where the inner holder 20 is housed in the shield shell 40, the tubular portion 26 of the inner holder 20 passes through the front tube portion 42 of the shield shell 40 and is fitted into the rear tube portion 43, and the box-shaped portion 25 of the inner holder 20 is fitted into the front tube portion 42. Also, in the process of attaching the inner holder 20 to the shield shell 40, the lock arm 34 elastically bends upward due to interference with the upper plate portion 45 of the shield shell 40.

Then, when the inner holder 20 and the shield shell 40 are in the properly attached state, the abutting portion 27 of the inner holder 20 abuts against the receiving portion 44 of the shield shell 40 from the front side, and thus the inner holder 20 is restricted from becoming displaced rearward relative to the shield shell 40. At the same time, the lock arm 34 undergoes elastic restoration downward, and the lock projection 37 is locked to the lock hole 46, thus restricting the inner holder 20 from becoming displaced forward relative to the shield shell 40. Accordingly, the inner holder 20 and the shield shell 40 are locked in an attached state where relative displacement in the forward-rearward direction is restricted, and furthermore relative displacement in the upward-downward and leftward-rightward directions is restricted. Also, the attachment portion 47 of the shield shell 40 is fixed to a grounding member such as a vehicle body before or after the step of attaching the inner holder 20 to the shield shell 40.

As described above, the shielded conduction path of the present embodiment includes the conduction path main body 10 in which the sheathed electrical wires 11 are surrounded by the tubular braided wire 14, the inner holder 20 through which the sheathed electrical wires 11 pass and that is made of a synthetic resin, and the shield shell 40 to which the braided wire 14 is fixed, and that can house the inner holder 20 and is made of a metal. The lock hole 46 is formed in a circumferential surface of the shield shell 40, and the inner holder 20 is provided with the lock arm 34 that has the lock projection 37 capable of being locked to the lock hole 46 and that locks the inner holder 20 and the shield shell 40 in the attached state.

In the present embodiment, the lock hole 46 is formed in a circumferential surface of the shield shell 40 as the means for locking the inner holder 20 and the shield shell 40 in the attached state. The lock hole 46 does not project from the inner circumference of the shield shell 40. Moreover, the upper end portion of the rear tube portion 43, which is arranged at a lower position than the upper plate portion 45, exists in the vicinity of the rearward side of the upper plate portion 45 in which the lock hole 46 is formed. For this reason, even if the sheathed electrical wires 11 inserted through the shield shell 40 slide over the rear tube portion 43 in which the lock hole 46 is not formed, they will not come into contact with the opening edge of the lock hole 46 in the inner circumferential surface of the shield shell 40. Accordingly, there is no risk that the insulating coverings 13 on the outer circumference of the sheathed electrical wires 11 will become damaged by the shield shell 40 (the opening edge of the lock hole 46).

Also, the shielded conduction path includes the tying band 50 that can fix the sheathed electrical wires 11 and the inner holder 20 in the state of being positioned in the axial direction of the sheathed electrical wires 11. According to this configuration, when the shield shell 40 is to be fixed to a vehicle body or the like in the state where the sheathed electrical wires 11 have been inserted through the shield shell 40 and the inner holder 20, there is no risk that the inner holder 20 will move along the sheathed electrical wires 11 and interfere with the shield shell 40, and therefore workability when fixing the shield shell 40 is favorable.

Also, the tying band 50 comes into close contact with the outer circumferential surface of the inner holder 20 (the electrical wire holding portion 30) and the outer circumferential surfaces of the sheathed electrical wires 11, and surrounds and constricts the inner holder 20 (the electrical wire holding portion 30) and the sheathed electrical wires 11. Accordingly, the inner holder 20 and the sheathed electrical wires 11 can be easily and reliably positioned and fixed. Furthermore, the inner holder 20 is provided with the stopper 32 that positions the tying band 50 in the circumferential direction by abutting against the head portion 53 from below, and therefore workability when fastening the tying band 50 is superior.

Furthermore, the inner holder 20 is constituted by the pair of half members 21 and 22 that can be joined so as to sandwich the sheathed electrical wires 11 in the diameter direction, and therefore workability when attaching the inner holder 20 and the sheathed electrical wires 11 is favorable. Moreover, the pair of half members 21 and 22 are provided with the locking arm 29 and the locking protrusion 28 that are for locking the pair of half members 21 and 22 in the joined state by locking to each other. The locking arm 29 and the locking protrusion 28 are housed inside the shield shell 40 (the front tube portion 42) in the state where the inner holder 20 and the shield shell 40 are attached to each other. According to this configuration, there is no risk of the locking arm 29 and the locking protrusion 28 becoming separated due to interference with a foreign object, and the half members 21 and 22 can be reliably held in the joined state.

Other Embodiments

The present invention is not intended to be limited to the embodiment described using the above descriptions and drawings, and the technical scope of the present invention also encompasses various embodiments such as the following, for example.

Although the stopper for positioning the tying band in the circumferential direction is provided in the above embodiment, a configuration is possible in which this stopper is not provided.

Although the tying band is used as a fixing member by which the sheathed electrical wires and the inner holder are positioned in the axial direction and fixed in the above embodiment, the fixing member is not limited to a tying band, and may be adhesive tape or the like.

Although the sheathed electrical wires and the inner holder are positioned in the axial direction and fixed by the fixing member (the tying band) in the above embodiment, a configuration is possible in which the fixing member is not provided.

Although the inner holder is obtained by joining the pair of half members that sandwich the sheathed electrical wires in the diameter direction in the above embodiment, the inner holder may be a tubular member that does not change in shape.

Although the pair of half members are coupled by the hinge portion in the above embodiment, the pair of half members may be parts that are separate from each other.

Although the locking portions that hold the half members in the joined state are housed inside the shield shell in the above embodiment, the locking portions may be exposed to the outside of the shield shell in the state where the inner holder and the shield shell are attached to each other.

Although the braided wire is used as the shield member in the above embodiment, the shield member may be a tubular part formed by a bendable metal foil, a part obtained by forming a conductive film or layer on a flexible tubular non-conductive member, or the like.

The invention claimed is:

1. A shielded conduction path comprising:
   a conduction path main body in which a sheathed electrical wire is surrounded by a tubular shield member;
   an inner holder through which the sheathed electrical wire passes and that is made of a synthetic resin;
   a shield shell to which the shield member is fixed, and that can house the inner holder and is made of a metal;
   a lock hole formed in a circumferential surface of the shield shell; and
   a lock arm that is formed on the inner holder, has a lock projection and a leg portion integrally formed to the lock projection, the lock projection capable of locking to the lock hole, and locks the inner holder and the shield shell in an attached state,
   wherein the leg portion that extends beyond on an outer surface of the inner holder to a height configured to position the lock projection over the lock hole so as to downwardly engage the lock hole, and an arm portion that extends from the leg portion, and the lock projection is provided protruding inward on a leading end portion of the arm portion.

2. The shielded conduction path according to claim 1, wherein the inner holder is configured by a pair of half members joined together by a deformable hinge so as to be releasably attached to each other and sandwich the sheathed electrical wire in a diameter direction.

3. The shielded conduction path according to claim 1, wherein a fixing member is a tying band that comes into close contact with an outer circumferential surface of the inner holder and an outer circumferential surface of the sheathed electrical wire, and surrounds and constricts the inner holder and the sheathed electrical wire.

4. The shielded conduction path according to claim 3, wherein a stopper that positions the tying band in a circumferential direction is formed on the inner holder.

5. The shielded conduction path according to claim 2, wherein the pair of half members are provided with locking portions that can lock to each other and that hold the pair of half members in a joined state, and the locking portions are housed in the shield shell.

* * * * *